(12) United States Patent
Groshert et al.

(10) Patent No.: US 9,276,248 B2
(45) Date of Patent: Mar. 1, 2016

(54) CELL CONNECTOR

(75) Inventors: Jan Groshert, Dettingen (DE); Armin Diez, Lenningen (DE)

(73) Assignee: ElringKlinger AG, Dettingen (DE)

(*) Notice: Subject to any disclaimer, the term of this patent is extended or adjusted under 35 U.S.C. 154(b) by 918 days.

(21) Appl. No.: 13/507,437

(22) Filed: Jun. 27, 2012

(65) Prior Publication Data

US 2013/0004823 A1　Jan. 3, 2013

(30) Foreign Application Priority Data

Jun. 30, 2011　(DE) .......................... 10 2011 051 462

(51) Int. Cl.
| | |
|---|---|
| *H01M 10/48* | (2006.01) |
| *H01M 2/32* | (2006.01) |
| *H01M 2/20* | (2006.01) |
| *H01R 11/28* | (2006.01) |
| *G01R 31/36* | (2006.01) |

(52) U.S. Cl.
CPC .............. *H01M 2/202* (2013.01); *H01M 10/48* (2013.01); *H01R 11/288* (2013.01); *G01R 31/3696* (2013.01); *H01M 2/32* (2013.01); *H01R 2201/20* (2013.01); *Y10T 29/49208* (2015.01)

(58) Field of Classification Search
None
See application file for complete search history.

(56) References Cited

U.S. PATENT DOCUMENTS

| 8,114,540 | B2 | 2/2012 | Trester .......................... 429/160 |
| 2009/0274956 | A1 | 11/2009 | Kosugi et al. ................. 429/158 |
| 2011/0177380 | A1* | 7/2011 | Langhoff ...................... 429/158 |
| 2012/0100761 | A1 | 4/2012 | Große et al. .................. 439/774 |
| 2012/0208410 | A1 | 8/2012 | Ikeda et al. ................... 439/883 |
| 2012/0276431 | A1 | 11/2012 | Groshert ......................... 429/99 |

FOREIGN PATENT DOCUMENTS

| CN | 10165880 | 2/2010 |
| DE | 10 2009 050 316 A1 | 4/2011 |
| WO | WO 2010/142679 A1 | 12/2010 |
| WO | WO 2011/021452 A1 | 2/2011 |
| WO | WO 2011/045088 | 4/2011 |

* cited by examiner

*Primary Examiner* — Tracy Dove

(57) ABSTRACT

In order to provide a cell connector for the electrically conductive connection of a first cell terminal of a first electrochemical cell and a second cell terminal of a second electrochemical cell of an electrochemical device comprising a base body and a contact body, which is connected to the base body and is connected to one of the cell terminals in the assembled state of the cell connector, at which an electric potential is detectable in a particularly simple manner, it is proposed that the contact body comprises a voltage tap.

15 Claims, 4 Drawing Sheets

CELL CONNECTOR

RELATED APPLICATION

The present disclosure relates to the subject matter disclosed in German Patent Application No. 10 2011 051 462.7 of 30 Jun. 2011, the entire specification of which is incorporated herein by reference.

FIELD OF DISCLOSURE

The present invention relates to a cell connector for the electrically conductive connection of a first cell terminal of a first electrochemical cell and a second cell terminal of a second electrochemical cell of an electrochemical device, wherein the cell connector comprises a base body and a contact body, which is connected to the base body and in the assembled state of the cell connector is connected to one of the cell terminals.

BACKGROUND

Such electrochemical devices can be configured in particular as electrical accumulators, e.g. as lithium-ion accumulators.

In the case of a lithium-ion accumulator the voltage difference between the two cell terminals (poles) of an individual accumulator cell amounts to approximately 3.6 V. To obtain a higher voltage level of approximately 360 V, for example, needed for many applications, e.g. in automotive drive technology, a plurality of such accumulator cells (e.g. approximately 100) must be electrically connected in series.

In this case, the accumulator cells or electrochemical cells in general can be combined into modules, which respectively contain a multiplicity of such electrochemical cells, wherein the installation direction of adjacently arranged cells alternates so that positive and negative cell terminals alternately lie adjacent to one another.

These adjacent cell terminals of opposite polarity are directly connected to one another by means of a respective cell connector for the series connection of the cells.

The contact body connected to the base body serves to achieve a connection of the cell connector to the respective cell terminal having a reliable, fail-safe and low contact resistance.

To effect monitoring of individual cells, differences in electric potential between different cell connectors are measured. In known potential monitoring operations the measuring points are soldered into a circuit board by means of cable, wire or conductive material.

SUMMARY OF THE INVENTION

The object forming the basis of the present invention is to be able to detect and evaluate the electric potential at the cell connector in a particularly simple manner.

This object is achieved according to the invention with a cell connector with the features of the preamble of claim 1 in that the contact body comprises a voltage tap.

Therefore, the underlying concept of the present invention is to integrate the function of the voltage tap into the contact body of the cell connector.

In this way, there is a saving in additional structural parts and material transitions. In the solution according to the invention no additional material and no coating of material already used are required to effect the voltage tap function at the cell connector.

Rather, the cell voltage measurement can be conducted directly by means of a structural part already present, namely the contact body.

In particular, no coating on the base body is necessary for detection of the electric potential at the cell connector. In particular, such a coating may otherwise be necessary to assure the ability of a measuring point to be soldered in, in particular when the base body is formed from aluminium or an aluminium alloy, for example.

Moreover, it is not necessary to attach elements made of another conductive material, e.g. of copper or a copper alloy, to the cell connector for detection of the electric potential at the cell connector.

Because of the absence of additional materials and additional coatings the production costs are reduced by the solution according to the invention.

Since material transition points at which a corrosive attack could occur are reduced, the corrosion resistance of the cell connector according to the invention is increased. In particular, an otherwise necessary corrosion protection can be omitted.

The contact body is preferably connected with the base body by a substance-to-substance bond, e.g. by welding, soldering and/or adhesion.

The contact body is preferably secured to a side of the base body directed towards the cell terminals in the assembled state of the cell connector.

Moreover, it is preferably provided that the contact body is arranged between the base body and one of the cell terminals in the assembled state of the cell connector.

The voltage tap of the contact body is preferably in the form of a web member.

In a preferred configuration of the invention it is provided that the contact body comprises a contact region, which is connected to a joining face of the base body in the assembled state of the cell connector and is formed in one piece with the voltage tap.

It is particularly favourable for handling of the contact body and the cell connector produced by the use thereof if the contact body is formed in one piece overall and therefore all components of the contact body are connected to one another in one piece.

In a special configuration of the invention it is provided that the base body comprises a first material and the contact body comprises a second material that is different from the first material.

The base body is preferably formed substantially completely from the first material.

Moreover, the contact body is preferably formed substantially completely from the second material.

The base body preferably comprises aluminium and/or copper.

In particular, it can be provided that the base body contains aluminium or copper as the main component.

In this case, the main component of a material is seen as the component that has the highest proportion by weight of the respective material.

In particular, the base body can be formed from an aluminium alloy or from a copper alloy.

The contact body preferably comprises nickel.

In particular, it can be provided that the contact body comprises nickel as the main component.

In particular, the contact body can be formed from a nickel alloy.

The use of a contact body formed completely or partially from nickel is advantageous in particular when the cell terminal, to which the contact body is connected in the assembled state of the cell connector, itself comprises nickel, preferably as the main component, or a coating with nickel, preferably as the main component.

The contact body is preferably connected with the base body of the cell connector by a substance-to-substance bond.

In particular, it can be provided that the base body is connected to the base body by welding, in particular by ultrasonic welding.

The voltage tap of the contact body preferably has a contacting element for connecting to a voltage tap line of the electrochemical device.

Such a contacting element can be configured, for example, as a soldering pin.

The cell connector according to the invention is suitable in particular for use in an electrochemical device, which comprises at least one first electrochemical cell with a first cell terminal and a second electrochemical cell with a second cell terminal and also at least one cell connector according to the invention, wherein the contact body of the cell connector is connected to one of the cell terminals.

In a preferred configuration it is provided that the contact body is only connected to one of the cell terminals, which are connected electrically conductively to one another by means of the cell connector.

Preferably, the contact body is connected with one of the cell terminals by a substance-to-substance bond.

In particular, the contact body can be connected to one of the cell terminals by welding, in particular laser welding.

In a preferred configuration of the invention it is provided that the cell terminal connected to the contact body has a contact face, which has the same main component as the material of the contact region.

In particular, it can be provided that the contact face of the cell terminal connected to the contact body contains nickel, preferably as the main component.

The electrochemical device, in which the cell connector is used, can be configured in particular as an accumulator, e.g. as a lithium-ion accumulator.

If the electrochemical device according to the invention is configured as an accumulator, it is suitable in particular as a high loading capacity energy source, e.g. for the drive of motor vehicles.

The contact body of the cell connector serves in particular as a welding aid, which facilitates a substance-to-substance bond of the cell connector to a cell terminal of an electrochemical cell by welding, in particular by laser welding.

The present invention additionally relates to a method for creating an electrically conductive connection between a first cell terminal of a first electrochemical cell and a second cell terminal of a second electrochemical cell.

An additional object forming the basis of the present invention is to provide such a method, by means of which such an electrically conductive connection, at which an electric potential is detectable, is created in a particularly simple manner.

This object is achieved according to the invention by a method for creating an electrically conductive connection between a first cell terminal of a first electrochemical cell and a second cell terminal of a second electrochemical cell, which comprises the following method steps:
  producing a base body of a cell connector;
  producing a contact body of a cell connector separately from the base body, wherein the contact body comprises a voltage tap;
  connecting the contact body to the base body;
  connecting one of the cell terminals to the contact body;
  connecting the cell connector to the other cell terminal;
  connecting the voltage tap to a voltage tap line of the electrochemical device.

Special configurations of the method according to the invention have already been explained above in association with the cell connector according to the invention and the electrochemical device according to the invention.

Further features and advantages of the invention are the subject of the following description and the graphical representation of an exemplary embodiment.

BRIEF DESCRIPTION OF THE DRAWINGS

Identical or functionally equivalent elements are given the same reference numerals in all figures.

DETAILED DESCRIPTION OF THE INVENTION

Figure 1:
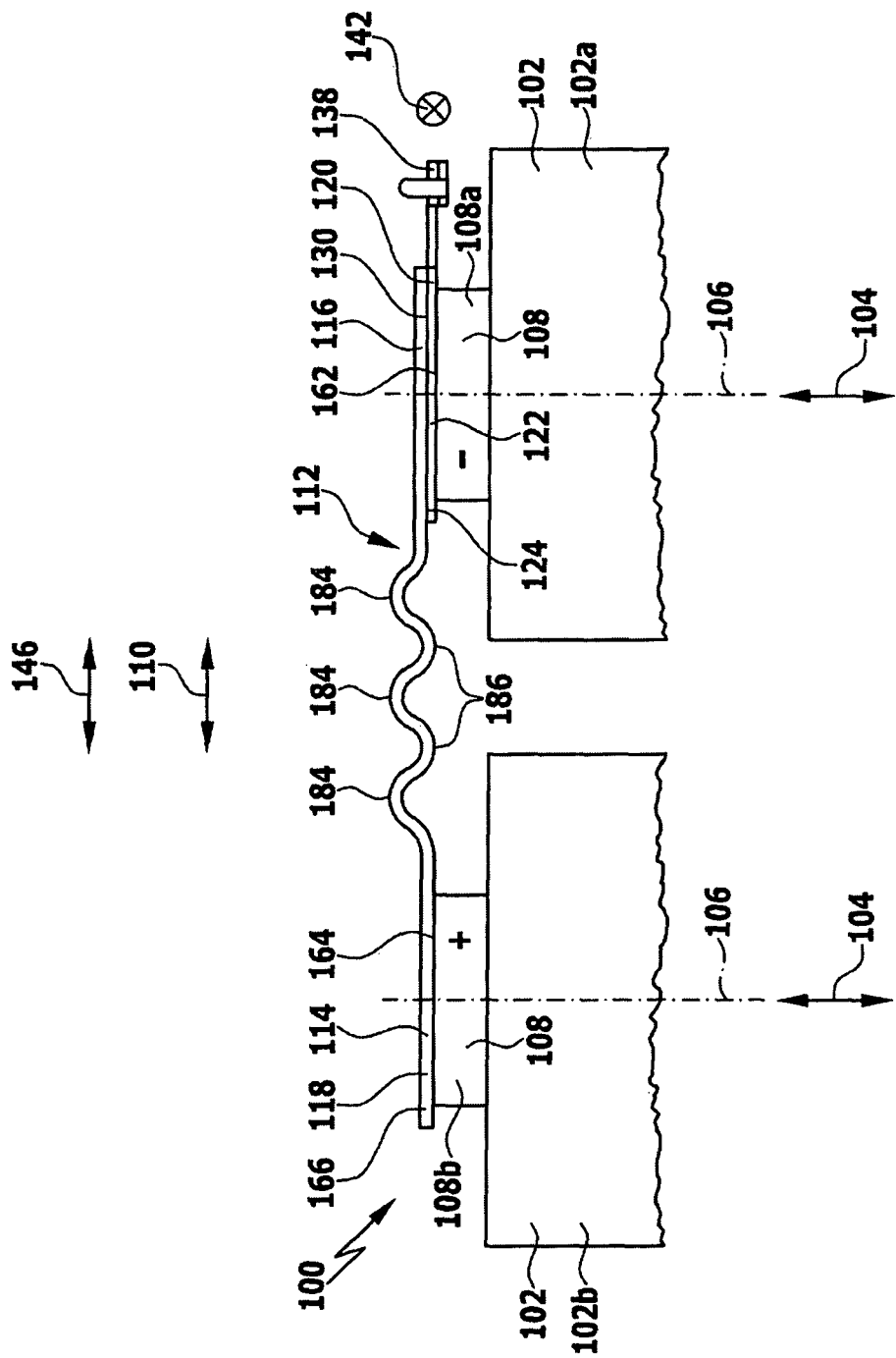
FIG. 1 is a schematic side view of a cell connector and two electrochemical cells, the cell terminals of which are connected to one another by means of the cell connector.

An electrochemical device given the overall reference 100 comprises, for example, a plurality of electrochemical modules (not shown), each of which comprises a plurality of, e.g. respectively eight or twelve, electrochemical cells 102, which are respectively received in a seating of a receiving device (not shown) of the module.

Such a receiving device can be configured in particular as a cooling body, which is in thermally conductive contact with the electrochemical cells received therein, and conduct heat away from the electrochemical cells 102 during operation of the electrochemical device 100.

The electrochemical cells 102 are arranged and oriented in the receiving device surrounding them such that axial directions 104 of the electrochemical cells 102 that run parallel to the centre longitudinal axes 106 of the electrochemical cells 102 are oriented substantially parallel to one another.

In this case, each of the electrochemical cells 102 extends from a front cell terminal 108 in the respective axial direction 104 as far as a rear cell terminal (not shown), wherein each cell terminal respectively forms a positive pole or a negative pole of the electrochemical cell 102.

In this case, the centre longitudinal axes 106 of the electrochemical cells 102 are at the same time centre longitudinal axes of the cell terminals 108 of the respective electrochemical cells 102.

Electrochemical cells 102 adjacent to one another are respectively oriented in a module such that the cell terminals of two adjacent cells 102a, 102b arranged on the same side of the module have opposing polarity.

Thus, in the cell arrangement shown in FIG. 1, for example, the front cell terminal 108a of the electrochemical cell 102a forms a negative pole of the respective electrochemical cell 102a, whereas the front cell terminal 108b of the electrochemical cell 102b adjacent to the electrochemical cell 102a in a connection direction 110 forms a positive pole of the electrochemical cell 102b.

The electrochemical device 100 can be configured in particular as an accumulator, preferably as a lithium-ion accumulator, e.g. of the type $LiFePO_4$.

The electrochemical cells 102 of the electrochemical modules can accordingly be configured as accumulator cells, in particular lithium-ion accumulator cells, e.g. of the type LiFePO$_4$.

Each electrochemical module additionally comprises a plurality of cell connectors 112, by means of which the cell terminals 108 of adjacent electrochemical cells 102 are connected electrically conductively to one another with different polarity in order to connect all electrochemical cells 102 of an electrochemical module electrically in series in this way.

In this case, each cell connector 112 connects a first cell terminal 108 of negative polarity to a second cell terminal 108b of positive polarity of an adjacent electrochemical cell 102.

To connect all electrochemical cells 102 of a module electrically in series, besides the front cell terminals 108 of adjacent electrochemical cells, the rear cell terminals of adjacent electrochemical cells of a module are also connected to one another by means of cell connectors (not shown).

Each of the cell connectors 112, which respectively connect a first cell terminal 108a and a second cell terminal 108b electrically conductively to one another, comprises a base body 114 with a first contact section 116, which in the assembled state of the cell connector 112 is arranged adjacent to a (e.g. negative) first cell terminal 108a of an electrochemical cell 102a, and a second contact section 118, which in the assembled state of the cell connector 112 is connected to a (e.g. positive) second cell terminal 108b of another electrochemical cell 102b.

Figure 3:
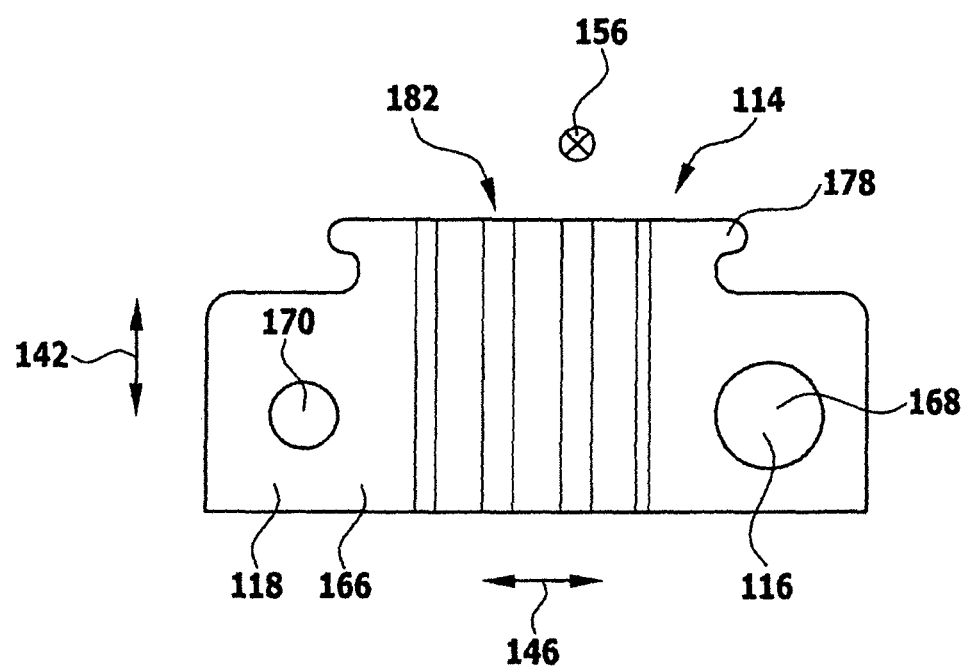
FIG. 3 is a schematic plan view onto a base body of the cell connector from FIGS. 1 and 2.

The base body 114 of the cell connector 112 shown individually in FIG. 3 is preferably produced as a stamped bent part.

In principle, the base body 114 of the cell connector 112 can be formed from any electrically conductive material, in particular from a metallic material, an electrically conductive plastic material and/or a conductive carbon material.

In particular, the base body 114 of the cell connector 112 can be formed from aluminium, copper, tin, zinc, iron, gold or silver or from an alloy of one or more of the aforementioned metals.

The base body 114 of the cell connector 112 is preferably formed from aluminium or an aluminium alloy or from copper or a copper alloy.

The base body 114 can be single-layered or multilayered.

With a multilayered configuration a plurality of layers of the base body 114 can be formed in one piece with one another. Alternatively or additionally hereto, it can also be provided that a plurality of layers of the base body are produced separately from one another and upon assembly of the cell connector are connected to one another, in particular by a substance-to-substance bond.

Moreover, the cell connector 112 comprises a contact body 120, which is produced separately from the base body 114 and in the region of the first contact section 116 is secured, preferably by a substance-to-substance bond, to the side of the base body 114 directed towards the cell terminals 108.

The contact body 120 can be connected to the base body 114 of the cell connector 112 in particular by welding, e.g. ultrasonic welding, by soldering and/or by adhesion.

The contact body 120 is also preferably produced as a stamped bent part.

Figure 4:
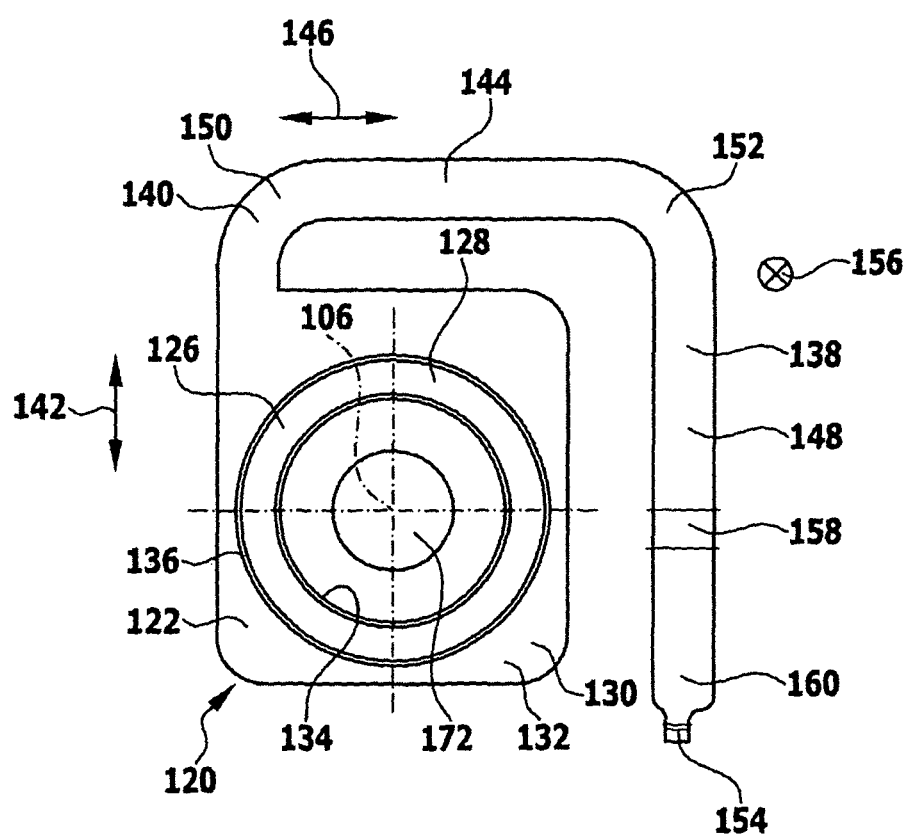
FIG. 4 is a schematic plan view onto a contact body of the cell connector from FIGS. 1 to 3.

The contact body 120 shown individually in FIG. 4 comprises a contact region 122, which is substantially rectangular, for example, and which in the assembled state of the cell connector 112 is connected to a joining surface 124 of the base body 114 directed toward the contact body 120 and in the assembled state of the electrochemical device 100 is connected to one of the cell terminals 108, e.g. to the negative first cell terminal 108a, by a substance-to-substance bond.

In particular, it can be provided that the contact region 122 of the contact body 120 is connected to the cell terminal 108a by welding, in particular by laser welding.

To facilitate the formation of a substance-to-substance bond between the contact region 122 of the contact body 120, on the one hand, and the first contact section 116 of the base body 114, on the other, by means of an ultrasonic joining process, it can be provided that the contact region 122 is provided with a raised section 126 projecting towards the base body 114, which with a contact face 128 abuts against the joining surface 124 of the base body 114 at the beginning of the ultrasonic joining process, wherein the contact face 128 is smaller than the entire joining surface 130 of the contact region 122 of the contact body 120 directed towards the base body 114.

During a linear or torsional ultrasonic welding process the raised section 126 of the contact body 120 penetrates into the base body 114 until the raised section 126 is embedded in the material of the base body and the remaining surface 132 of the joining surface 130 of the contact region 122 located outside the contact face 128 of the raised section 126 abuts against the joining surface 124 of the base body 114.

The raised section 126 can be configured in a ring shape, for example, and can be configured as a double half-bead, for example, with an inner flank 134 descending from an inner edge of the contact face 128 to the remaining surface 132 and an outer flank 136 descending from an outer edge of the contact face 128 to the remaining surface 132.

Besides the contact region 122, the contact body 120 comprises a voltage tap 138, which is in the form of a web member, for example, and which is formed in one piece with the contact region 122 of the contact body 120 and extends away from the contact region 122.

In particular, it can be provided that the web-like voltage tap 138 has an initial section 140, which is connected to the contact region 122 and runs substantially parallel to a transverse direction 142 of the cell connector 112, for example, a middle section 144, which follows the initial section 140 and runs substantially parallel to a longitudinal direction 146 of the cell connector 112, for example, and an end section 148, which follows the middle section 144 and runs substantially parallel to the transverse direction 142 of the cell connector 112, for example.

The transverse direction 142 and the longitudinal direction 146 of the cell connector 112 run perpendicularly to one another.

In this case, the initial section 140 of the voltage tap 138 is preferably connected to the middle section 144 of the voltage tap 138 by means of a first curved intermediate section, whereas the middle section 144 is preferably connected to the end section 148 by means of a second curved intermediate section 152.

The end section 148 of the voltage tap 138 is preferably provided with a contacting element 154 at its free end for connection of the voltage tap 138 to a voltage tap line (not shown) of the electrochemical device 100.

The contacting element 154 can be configured as a soldering pin, for example, to which the voltage tap 138 is solderable with a voltage tap line.

To be able to change the vertical position of the contacting element 154, i.e. its positioning in a contact direction 156 of the cell connector 112 perpendicular to the transverse direction 142 and to the longitudinal direction 146, in a desired manner in relation to the vertical position of the contact region 122, the voltage tap 138 can be provided with an offset 158, in particular in its end section 148.

The offset 158 preferably runs substantially transversely, in particular substantially perpendicularly, to a longitudinal direction of the end section 148.

In principle, in the assembled state of the electrochemical device 100 the offset part 160 of the voltage tap 138 can be offset in relation to the contact region 122 towards the cell terminal 108a or away from the cell terminal 108a.

In the case of the embodiment shown in the drawings the offset part 160 of the voltage tap 138 is offset in relation to the contact region 122 towards the cell terminal 108a.

The voltage tap 138 preferably has substantially the same average material thickness as the contact region 122 of the contact body 120.

The contact body 120 formed in one piece preferably comprises a material different from the material of the base body 114 and is preferably formed substantially completely from a material different from the material of the base body 114.

In particular, it can be provided that the contact body 120 is formed from nickel or a nickel alloy.

The cell terminal 108a connected with the contact region 122 of the contact body 120 terminal 108a by a substance-to-substance bond preferably has a contact face 162, which contains the same main component as the material of the contact body 120.

The contact face 162 of the cell terminal 108a connected to the contact region 122 of the contact body 120 is preferably formed from nickel or a nickel alloy.

However, the second cell terminal 108b connected electrically conductively to the first cell terminal 108a by means of the cell connector 112 preferably has a contact face 164, the main component of which is the same as the main component of the material of the base body 114.

If the base body 114 is formed from aluminium or an aluminium alloy, the contact face 164 of the second cell terminal 108b is thus preferably likewise formed from aluminium or an aluminium alloy.

The second contact section 118 of the base body 114 is connected directly, preferably by a substance-to-substance bond, to the second cell terminal 108b.

Such a substance-to-substance bond can be created in particular by welding, in particular laser welding, or by soldering.

The second contact section 118 of the base body 114 thus forms a second contact region 166 of the cell connector 112, which in the assembled state of the electrochemical device 100 is connected to the second cell terminal 108b, whereas the contact region 122 of the contact body 120 forms a first contact region of the cell connector 112, which in the assembled state of the electrochemical device 100 is connected to the first cell terminal 108a.

To also allow a direct access, e.g. for measurement purposes, to the cell terminals 108a and 108b after connecting the cell connector 112 to the cell terminals 108a and 108b by a substance-to-substance bond, the first contact section 116 and the second contact section 118 of the base body 114 as well as the contact region 122 of the contact body 120 can be respectively provided with a through opening 168, 170 or 172 that is substantially circular, for example (see FIGS. 3 and 4).

Figure 2:
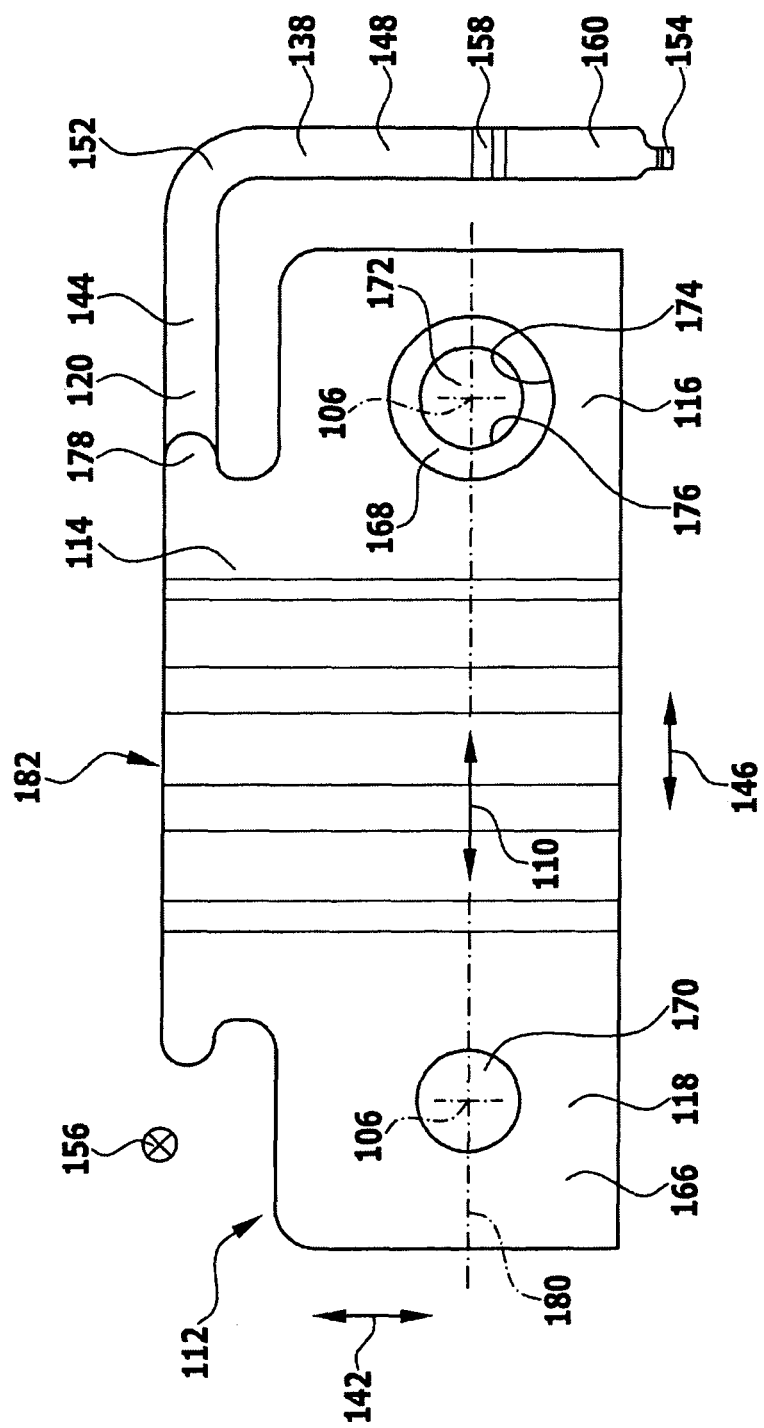
FIG. 2 is a schematic plan view from above onto the side of the cell connector of FIG. 1 remote from the cell terminals of the electrochemical cells.

In this case, the through opening 168 preferably has a larger passage surface in the first contact section 116 of the base body 114 than the through opening 172 in the contact region 122 of the contact body 120, such that the edge 174 of the through opening 168 in the first contact section 116 surrounds, preferably substantially concentrically, the edge 176 of the through opening 172 in the contact region 122 of the contact body 120 (see FIG. 2).

As is additionally evident from FIG. 2, it can be provided that the first contact section 116 of the base body 114 has a projection 178, which at least partially overlaps with the initial section 140 and the first curved intermediate section 150 of the voltage tap 138 of the contact body 120, so that these sections of the voltage tap 138 are supported by the base body 114.

During operation of the electrochemical device 100, because of different temperatures and/or because of different coefficients of thermal expansion of the cell connectors 112, on the one hand, and the receiving device for the electrochemical cells 102, on the other, a difference can occur between a longitudinal extension of the cell connectors 112, on the one hand, and a change in spacing between the longitudinal axes 106 of the cell terminals 108a, 108b connected to one another by the cell connectors 112, on the other. Because of a temperature change the relative positions of the cell terminals 108a, 108b connected to one another by a cell connector 112 are changed in the connection direction 110 oriented perpendicularly to the axial direction 104 of the electrochemical cells 102.

The connection direction 110 lies in a plane 180, which contains the longitudinal axes 106 of the electrochemical cells 102a and 102b (see FIG. 2).

Moreover, because of different longitudinal expansions of the electrochemical cells 102a, 102b connected to one another by a cell connector 112 a change in the relative positions between the interconnected cell terminals 108a, 108b can occur in the axial direction 104 of the interconnected electrochemical cells 102a, 102b.

To be able to compensate such differences between a longitudinal expansion of the cell connector 112, on the one hand, and a change in spacing between the longitudinal axes 106 of the cell terminals 108a, 108b connected to one another by the cell connector 112, on the other, and/or such differences between a longitudinal expansion of a first electrochemical cell 102a and a second electrochemical cell 102b, which are connected to one another by the cell connector 112, it can be provided that the cell connector 112 comprises an elastically and/or plastically deformable compensation region 182, which is arranged between the first contact region 122 and the second contact region 166 of the cell connector 112 and connects the two contact regions 122 and 166 to one another.

The base body 114 of the cell connector 112 is preferably provided with such a compensation region 182.

In the embodiment of a cell connector 112 shown in the Figures, the deformable compensation region 182 has an undulating structure, wherein the undulating structure comprises one or more, e.g. three, undulations with an amplitude directed parallel to the axial direction 104 of the cells 102a, 102b to be connected by means of the cell connector 112 and substantially perpendicular to the contact faces, with which the cell connector 112 abuts against the first cell terminal 108a or against the second cell terminal 108b in the assembled state. These undulations have a plurality of, e.g. three, undulation peaks 184 running transversely, preferably substantially perpendicularly, to the axial direction 104 of the electrochemical cells 102 and transversely, preferably substantially perpendicularly, to the longitudinal direction 146 of the cell connector 112 and substantially parallel to the transverse direction 142 of the cell connector 112, and a plurality of undulation troughs 186 arranged between the undulation peaks 184 and running transversely, preferably substantially perpendicularly, to the axial direction 104 of the electrochemical cells 102 and transversely, preferably substantially perpendicularly, to the longitudinal direction 146 of the cell connector 112 and substantially parallel to the transverse direction 142 of the cell connector 112.

In the assembled state of the electrochemical device 100 the longitudinal direction 146 of the cell connector 112 runs substantially parallel to the connection direction 110, and the transverse direction 142 of the cell connector 112 runs substantially perpendicularly to the connection direction 110.

The undulation peaks 184 project upwards in the contact direction 156 of the cell connector 112 perpendicular to the contact faces of the cell connector 112, which in the assembled state of the electrochemical device 100 is the same as the axial direction 104 of the electrochemical cells 102, whereas the undulation troughs 186 project downwards in the contact direction 156 (i.e. towards the cells 102 to be connected to one another).

As a result of the undulating structure of the deformable compensation region 124 of the cell connector 112, the compensation region 124 is easily elastically and/or plastically deformable in such a manner that the second contact region 166 can be displaced relative to the first contact region 122 both in the axial direction 104 of the electrochemical cells 102 and in the longitudinal direction 146 of the cell connector 112 to compensate the above-described differences in the relative positions of the cell terminals 108a and 108b to be connected to one another by means of the cell connector 112. As a result, excessive mechanical stresses at the connection points between the cell connector 112, on the one hand, and the first cell terminal 108 as well as the second cell terminal 108b, on the other hand, can be avoided.

The following procedure is followed to produce the cell connector 112 as shown in FIGS. 1 and 2:

Firstly, a base body preform is separated out, e.g. punched out or cut out (e.g. by means of a laser) of a starting material, e.g. a starting material in metal sheet form.

The undulation peaks 184 and undulation troughs 186 of the compensation region 182 are incorporated into the base body preform by means of suitable forming operations, in particular stamping or deep-drawing operations.

The through opening 168 of the first contact section 116 and the through opening 170 of the second contact section 118 can already be separated out of the base body preform before these forming operations, e.g. together with the separation of the outer contour of the base body preform out of the starting material, or after the forming operations.

The production of the base body 114 of the cell connector 112 is thus concluded.

The contact body 120 is likewise separated out, e.g. punched out or cut out (e.g. by means of a laser) of a starting material, e.g. a starting material in metal sheet form, separately from the base body 114.

The raised section 126 in the contact region 122 of the contact body 120 and the offset 158 on the voltage tap 138 of the contact body 120 are additionally produced by means of suitable forming operations, in particular stamping or deep-drawing operations.

The through opening 172 in the contact region 122 of the contact body 120 can already be separated out of the contact body 120 before these forming operations, e.g. together with the separation of the outer contour of the contact body 120 out of the starting material, or after the forming operations.

The contact body 120 is connected to the base body 114, preferably by a substance-to-substance bond.

This connection is preferably made by an ultrasonic welding operation.

The cell connector 112 produced from the base body 114 and the contact body 120 in this manner is connected, preferably by a substance-to-substance bond, with a respective cell terminal 108 of an electrochemical cell 102 in the contact regions 122 and 166.

The contacting element 154 of the voltage tap 138 of the contact body 120 is connected, e.g. by soldering, to a voltage tap line (not shown), which leads to an evaluation unit (likewise not shown) of the electrochemical device 100.

The invention claimed is:

1. Cell connector for the electrically conductive connection of a first cell terminal of a first electrochemical cell and a second cell terminal of a second electrochemical cell of an electrochemical device comprising,
    a base body and
    a contact body, which is connected to the base body and in the assembled state of the cell connector is connected to one of the cell terminals,
    wherein the contact body comprises a voltage tap and
    wherein the contact body comprises a contact region, which is connected to a joining face of the base body in the assembled state of the cell connector and is formed in one piece with the voltage tap.

2. Cell connector according to claim 1, wherein the contact body is secured to a side of the base body directed towards the cell terminals in the assembled state of the cell connector.

3. Cell connector according to claim 1, wherein the voltage tap is in the form of a web member.

4. Cell connector according to claim 1, wherein the base body comprises a first material and the contact body comprises a second material that is different from the first material.

5. Cell connector according to claim 1, wherein the base body comprises at least one of aluminium and copper.

6. Cell connector according to claim 1, wherein the contact body comprises nickel.

7. Cell connector according to claim 1, wherein the contact body is connected with the base body by a substance-to-substance bond.

8. Cell connector according to claim 7, wherein the contact body is connected to the base body by welding.

9. Cell connector according to claim 1, wherein the voltage tap has a contacting element for connecting to a voltage tap line of the electrochemical device.

10. Electrochemical device comprising,
    at least one first electrochemical cell with a first cell terminal and a second electrochemical cell with a second cell terminal and
    at least one cell connector for the electrically conductive connection of the first cell terminal of the first electrochemical cell and the second cell terminal of the second electrochemical cell of the electrochemical device,
    wherein the cell connector comprises a base body and a contact body, which is connected to the base body and is connected to one of the cell terminals in the assembled state of the cell connector,
    wherein the contact body comprises a voltage tap and a contact region, which is connected to a joining face of the base body in the assembled state of the cell connector and is formed in one piece with the voltage tap, and
    wherein the contact body of the cell connector is connected to one of the cell terminals.

11. Electrochemical device according to claim 10, wherein the contact body is connected with one of the cell terminals by a substance-to-substance bond.

12. Electrochemical device according to claim 11, wherein the contact body is connected to one of the cell terminals by welding.

13. Electrochemical device according to claim 10, wherein the cell terminal connected to the contact body has a contact face, the material of which has the same main component as the material of the contact region.

14. Electrochemical device according to claim 10, wherein the cell terminal connected to the contact body has a contact face, the material of which contains nickel.

15. Method for creating an electrically conductive connection between a first cell terminal of a first electrochemical cell and a second cell terminal of a second electrochemical cell of an electrochemical device comprising the following:
- producing a base body of a cell connector;
- producing a contact body of a cell connector separately from the base body, wherein the contact body comprises a voltage tap and a contact region, which is connected to a joining face of the base body in the assembled state of the cell connector and is formed in one piece with the voltage tap;
- connecting the contact body to the base body;
- connecting one of the cell terminals to the contact body;
- connecting the cell connector to the other cell terminal;
- connecting the voltage tap to a voltage tap line of the electrochemical device.

* * * * *